United States Patent [19]
Josephson

[11] Patent Number: 5,251,169
[45] Date of Patent: Oct. 5, 1993

[54] NON-VOLATILE ERASABLE AND PROGRAMMABLE INTERCONNECT CELL

[75] Inventor: Gregg Josephson, Aloha, Oreg.

[73] Assignee: Lattice Semiconductor Corporation, Hillsboro, Oreg.

[21] Appl. No.: 696,453

[22] Filed: May 6, 1991

[51] Int. Cl.$^5$ .................... G11C 7/00; G11C 11/40
[52] U.S. Cl. ............................... 365/72; 307/468; 340/825.83; 365/185; 365/189.08
[58] Field of Search ............ 365/72, 177, 185, 189.01, 365/189.08; 307/465, 468; 340/825.83

[56] References Cited

U.S. PATENT DOCUMENTS

| | | | |
|---|---|---|---|
| 4,387,444 | 6/1983 | Edwards | 365/185 X |
| 4,796,229 | 1/1989 | Greer, Jr. et al. | 365/189 |
| 4,827,450 | 5/1989 | Kowalski | 365/185 |
| 4,943,943 | 7/1990 | Hayashi et al. | 365/185 |
| 5,018,104 | 5/1991 | Urai | 365/185 X |

*Primary Examiner*—Siegfried H. Grimm
*Attorney, Agent, or Firm*—Skjerven, Morrill, MacPherson, Franklin & Friel

[57] ABSTRACT

A non-volatile, erasable and programmable interconnect cell which includes a pass transistor, a select transistor, and a floating gate transistor wherein a voltage applied to the pass transistor is drawn from a common connection between the floating gate transistor and the select transistor.

12 Claims, 1 Drawing Sheet

NON-VOLATILE ERASABLE AND PROGRAMMABLE INTERCONNECT CELL

BACKGROUND OF THE INVENTION

1. Field of the Invention

This invention relates to a non-volatile, erasable and programmable interconnect cell, and more specifically to a self-sensing interconnect cell.

2. Description of Related Art

Typically, in the prior art, static random access memory (SRAM) cells have been used to programmably control transistor switches to interconnect input and output leads. However, the use of SRAM cells in programmable interconnects has numerous disadvantages. For example, an SRAM cell generally requires four to six transistors, thereby resulting in a relatively large interconnect cell. Additionally, an SRAM cell is volatile, i.e. the cell must be reprogrammed if the power goes off.

Hence, attempts have been made to design an interconnect cell which is non-volatile. For example, floating gate transistors themselves have been used to connect input and output leads. Although this configuration reduces the size of the interconnect cell, the programming characteristics of a floating gate transistor result in inherently low performance relative to a standard non-programmable transistor.

Another prior art configuration includes a floating gate transistor and a select transistor coupled to a sense amplifier. The sense amplifier is then connected to a pass transistor which interconnects input and output leads. The sense amplifier provides a high performance interconnect by ensuring an efficient switching of the pass transistor, but, because of its size, sacrifices cell density in the process.

SUMMARY OF THE INVENTION

In accordance with this invention, a programmable interconnect cell is provided which overcomes certain of the disadvantages of the prior art by reducing the number of transistors and sensing means required in the memory cell, and ensuring a non-volatile memory, high speed, and low power consumption. The programmable interconnect cell of one embodiment of the present invention comprises a pass transistor connected to two leads. A programmable cell is connected to the control gate of the pass transistor, thereby providing voltages that selectively couple/uncouple the two leads. The programmable cell comprises a floating gate transistor connected to a select transistor. The voltage provided by the programmable cell is drawn from the common connection between the floating gate transistor and the select transistor.

This invention will be more fully understood in conjunction with the following detailed description taken together with the following drawings.

DETAILED DESCRIPTION OF THE PREFERRED EMBODIMENT

In accordance with the present invention, an erasable programmable read only memory (EPROM) or an electrically erasable programmable read only memory (EEPROM) is used. In general, an EPROM or EEPROM is characterized by having a "floating gate" to which there is no direct electrical connection, and a "control gate" to which an electrical potential is applied during program and erase operations. The floating gate is separated from a substrate region by a gate oxide layer of insulating material. The substrate region includes symmetrical source and drain regions (below the floating gate) which define a channel. The floating gate and control gate are separated by a layer of insulating material.

The principle upon which the EPROM or EEPROM device operates is that electrons, or charge, are stored on the "floating gate" in a capacitive manner, thereby creating a non-volatile memory. Programming and erasing take place by, for example, Fowler-Nordheim tunneling through a tunnel oxide region.

An interconnect cell comprising an EPROM or EEPROM device also reduces the total number of transistors previously required for the memory cell. One embodiment of the present invention which accomplishes this reduction is shown in FIG. 1.

Figure 1:
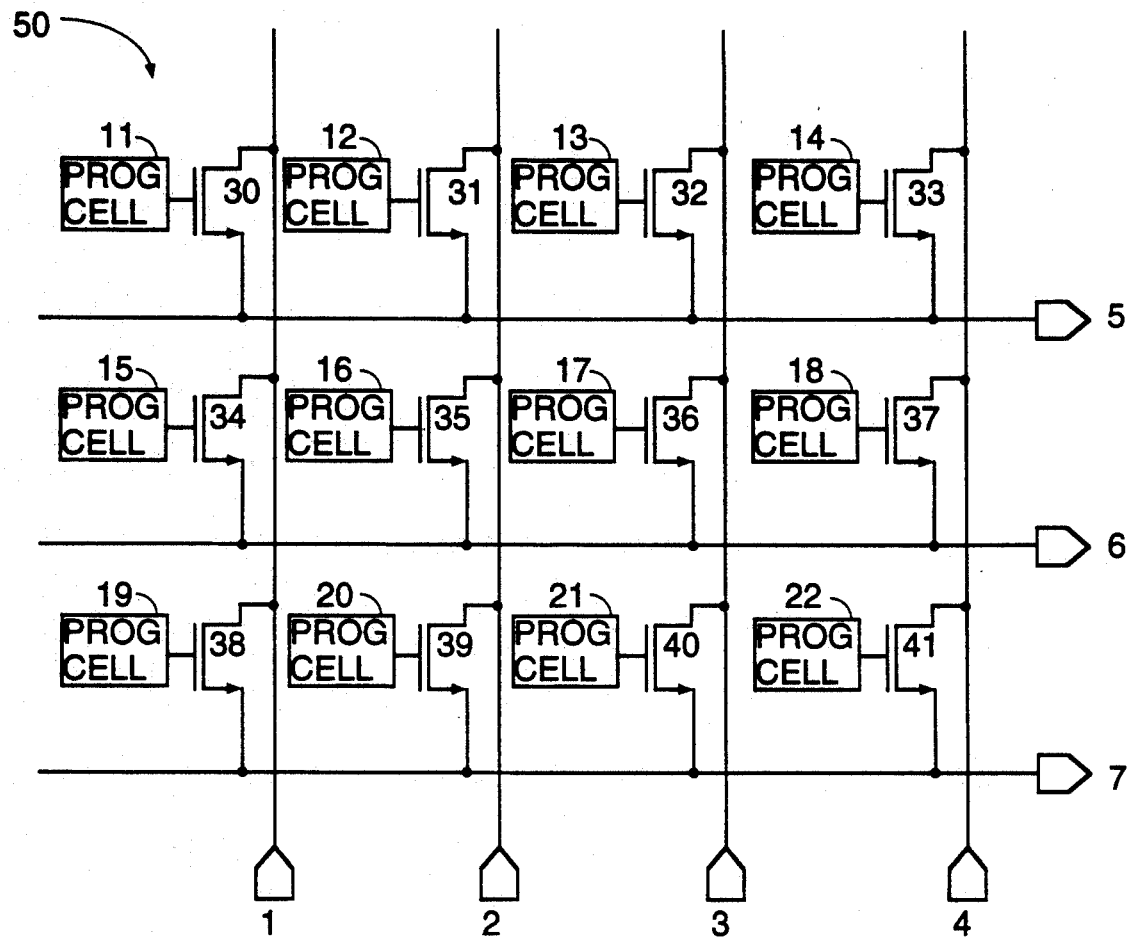
FIG. 1 is a block level schematic diagram of an illustrative fully populated interconnect matrix in accordance with the present invention.

Interconnect matrix 50 of FIG. 1 is organized into rows and columns of programmable cells and associated N-type field effect pass transistors. Thus, a first column comprises programmable cells 11, 15, 19, and associated pass transistors 30, 34, 38. The drains of pass transistors 30, 34, and 38 are connected to an input line 1. The sources of field effect pass transistors 30, 34, and 38 are connected to output lines 5, 6 and 7 respectively. The second, third, and fourth columns of programmable cells and associated pass transistors are configured in a similar manner and therefore are not described further.

Signals delivered on input leads 1, 2, 3 and/or 4 are selectively used to drive output leads 5, 6 or 7. In other words, by programming certain cells, the user selectively determines which input signal drives which output. In accordance with this invention a programmed cell makes a connection between input and output leads. In one embodiment of the present invention, an output lead is not connected to more than one input lead. Otherwise, the two input leads may contend for control of the output lead which results in an indeterminate output state.

FIG. 1 illustrates an interconnect matrix 50 of four input leads 1, 2, 3 and 4 and three output leads 5, 6 and 7. Generally, the number of output leads is less than or equal to the number of input leads. Recognizing the connection limitation described in the preceding paragraph, it logically follows that the number of possible programmed cells in the matrix is less than or equal to the number of outputs.

An input signal is delivered to the output lead if the programmable cell applies a proper voltage, i.e. a voltage of three to four volts is typically desired to sufficiently turn on the gate of its associated pass transistor. If the programmable cell applies a zero voltage to the gate of its associated pass transistor, no current flows and no connection between input and output leads is achieved. N-type transistors are used in one embodiment of this invention because N-type transistors provide less impedance than P-type transistors, thereby increasing the speed of the device. Moreover, N-type transistors also tend to pack more densely, thereby decreasing the size of the interconnect matrix.

In accordance with the present invention, the width and length of the pass transistors 30-41 have few limitations. Specifically, the larger the ratio of width to length of the pass transistor, the greater the size of the transistor, but the lower the impedance of the interconnect. Thus, a user can easily custom design an interconnect cell depending on whether the ultimate goal is higher density or higher speed. Additionally, the pass transistor allows impedance of the interconnect to be independent of the cell programming characteristics at a given voltage.

In one embodiment of the present invention shown in FIG. 1, because the interconnect matrix is fully populated, i.e. the intersection of each row and column of the matrix has an associated programmable cell and pass transistor, any input lead can be connected to any output lead in the matrix. Hence, out of the twelve programmable cells 11-22, a maximum of three (number of outputs) will be programmed to interconnect an input lead to an output lead. In practice, matrices of a minimum of ten inputs and ten outputs are common. Assuming a fully populated matrix, i.e. one hundred programmable cells in this example, a maximum of ten cells will be programmed (number of outputs). Therefore, a maximum of ten percent of the programmable cells will be programmed ($10 \div 100 = 10\%$). This percentage plays an important role in low power consumption by the interconnect matrix and will be described in more detail in a later section.

Figure 2:
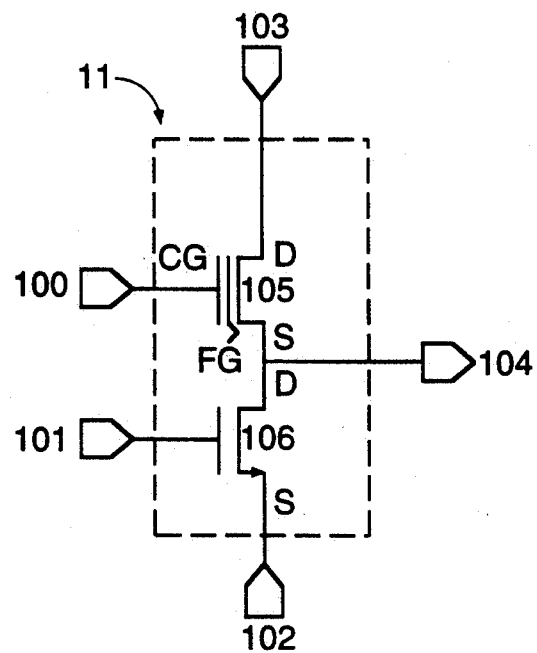
FIG. 2 is a component level schematic diagram of an illustrative programmable cell used at the interconnect in accordance with the present invention.

FIG. 2 shows a component-level schematic diagram of the programmable cell as used in the matrix of FIG. 1. Table 1 listed below includes five modes of operation for the programmable cell.

TABLE 1

| Five Modes of Operation with Associated Lead Voltages. | | | | |
|---|---|---|---|---|
| | 100 | 101 | 102 | 103 |
| Read | $V_{Ref}$ | $V_{Ref2}$ | GND | $V_{cc}$ |
| Erase | HV | 5 V | GND | Float |
| Program | −1.5 V | HV | HV | Float |
| Verify LoV$_t$ | −1.5 V | 5 V | I pull up | GND |
| Verify HiV$_t$ | $V_{Ref3}$ | 5 V | I pull up | GND |

The read mode is the normal mode for an interconnect cell. The read mode either connects the output lead to the input lead or maintains a state of disconnection, depending upon the bias created by voltages provided on leads 100-103 and the threshold voltage $V_t$ of floating gate transistor 105.

Regarding the biasing in the read mode, voltage $V_{Ref}$, for example around 1.2 volts, is provided on lead 100, a voltage of $V_{cc}$, typically five volts, is provided at lead 103, and lead 102 is grounded. A voltage of $V_{Ref2}$ is provided on lead 101, where $V_{Ref2}$ is just enough to barely turn on select transistor 106.

The connection and no connection states correlate to low and high threshold voltages (LoV$_t$, HiV$_t$) of floating gate transistor 105 which will be described in more detail hereinafter. Generally, a high threshold voltage HiV$_t$ is between three and four volts while a low threshold voltage LoV$_t$ is approximately −1.5 volts. As will be seen in subsequent sections, the high and low threshold voltages are set in the erase and program modes respectively.

If a high threshold voltage HiV$_t$ is set on floating gate transistor 105, then the read mode voltage $V_{Ref}$ will not be sufficient to turn on floating gate transistor 105 ($V_{Ref}<$ HiV$_t$). Because floating gate transistor 105 is off and select transistor 106 is on, select transistor 106 will draw the voltage on lead 104 to ground. Referring to Table 2 below, no current is established through transistors 105 and 106. Clearly, zero voltage will be provided on the gate of pass transistor 30 (for example) as seen in FIG. 1. As a result, pass transistor 30 is off and no connection between input lead 1 and output lead 5 is made.

TABLE 2

| Read Mode Results Given Low or High Threshold Voltage Set on Floating Gate Transistor 105. | | |
|---|---|---|
| | Voltage on Lead Lesser of $V_{cc}$ or | Current through Transistors 105 and 106 |
| LoV$_t$ | $V_{Ref} - T_t$ | <20 μA set by $V_{Ref2}$ and W/L of 106 |
| HiV$_t$ | φV | φμA | where $V_t$ is the threshold voltage of floating gate transistor 105.

However, if a low threshold voltage LoV$_t$ is set on floating gate transistor 105, then the read mode voltage $V_{Ref}$ will turn on floating gate transistor 105 ($V_{Ref}>$LoV$_t$). By biasing and sizing select transistor 106, the current is reduced to less than 20μ amps, thereby maximizing the voltage drop across select transistor 106. Therefore, the voltage on lead 104 will be the lesser of $V_{cc}$ (i.e. five volts) or a reference voltage $V_{Ref}$ minus the threshold voltage $V_t$. For example, if the voltage on lead 100 is 1.5 volts and the threshold voltage $V_t$ is equal to −1.5 volts or less, then a satisfactory threshold voltage on lead 104 is established ($1.5-(-1.5)=3$). In other words, a minimum of 3 volts is assured to be provided on lead 104. As a result, connection is made between input lead 1 and output lead 5.

Because an interconnect matrix in a typical application has 10 percent or less of its programmable cells programmed (i.e. transistor 105 has a high threshold voltage HiV$_t$), this results in low power consumption in the interconnect matrix for the read mode. Furthermore, in accordance with the present invention, no sensing means are required in the interconnect cell, thereby making the interconnect cell self-sensing.

A goal of the erase mode is to provide a threshold voltage $V_t$ of between three to four volts on floating gate transistor 105. This goal is accomplished by applying a high voltage HV, typically around 14 volts, to control gate CG of transistor 105 via lead 100; placing a voltage of, for example, five volts on lead 101; grounding lead 102, and allowing lead 103 to float. This causes electrons to tunnel from the drain region of transistor 105 through the tunnel oxide layer to floating gate FG. This tunneling results in a sufficient number of electrons being stored within floating gate FG of transistor 105 to increase the threshold voltage $V_t$ of transistor 105 such that transistor 105 will not turn on in response to read voltage $V_{Ref}$ applied to lead 100 during the read mode.

In the program mode, the goal is to provide a threshold voltage $V_t$ of approximately −1.5 volts on floating gate transistor 105. This is accomplished by reversing the tunneling process. Hence, a positive charge is stored on the floating gate FG of transistor 105 by tunneling electrons from floating gate FG of transistor 105 through the tunnel oxide and into the drain region of that transistor. In one embodiment of the present invention, this is done by providing −1.5 volts on lead 100, applying a high voltage on leads 101 and 102 and, allowing lead 103 to float. Note that when applying these voltages that the source region of transistor 105 effectively becomes the drain region and vice versa.

The particular voltages recommended in Table 1 for configuring the programmable cells are illustrative. For example, referring to the use of −1.5 volts provided on lead 100 in the program mode, the more negative that voltage, the higher the voltage across the tunnel oxide and, therefore, the lower the programmed threshold voltage $V_t$ becomes. As indicated above, the goal is to provide a proper voltage across the tunnel oxide, thereby setting an appropriate threshold voltage $V_t$ for transistor 105.

In the final two modes of operation, verification is done to insure that transistor 105 has the proper threshold voltage $V_t$. Specifically, the purpose of the verify low threshold voltage $LoV_t$ mode is to verify that, in fact, −1.5 volts has been set as the threshold voltage $V_t$ of transistor 105 after programming has occurred. This verification is accomplished by providing −1.5 volts on lead 100, providing five volts on lead 101, setting lead 103 to ground, and connecting a current source I pull-up to lead 102. If threshold voltage $V_t$ on floating gate transistor 105 is set to less than −1.5 volts, then both transistors, i.e. floating gate transistor 105 and select transistor 106, are on and the voltage on lead 102 will be pulled down to ground. If the voltage on lead 102 is not pulled down, threshold voltage $V_t$ has not been programmed low enough. Hence, floating gate transistor 105 has an unacceptable threshold voltage.

The purpose of the verify high threshold voltage $HiV_t$ mode is to verify that the threshold voltage $V_t$ of floating gate transistor 105 is approximately three to four volts after erasing of floating gate transistor 105. To accomplish this verification, a similar process is followed.

All input voltages are identical to the verify low threshold voltage mode $LoV_t$ with the exception of the voltage applied to lead 100. In the verify high threshold voltage $HiV_t$ mode, a reading mode voltage, i.e., $V_{Ref3}$, where $V_{Ref3}$ is higher than $V_{Ref}$ by approximately one volt (using provided voltages, $V_{Ref3}$ is between 2.0 and 2.5 volts), or higher, is applied to the control gate of transistor 105. Assuming a proper high threshold voltage has been established, floating gate transistor 105 remains off. Hence, the voltage on lead 102 will be drawn up to five volts by select transistor 106. If the voltage on lead 102 is not drawn up, then floating gate transistor 105 has turned on in response to the reference voltage $V_{Ref3}$ and is erased to an unacceptably low level.

While our invention has been described with respect to certain embodiments, the scope of the present invention is defined by the appended claims and is not necessarily limited to the embodiments described herein, which are merely illustrative. For example, the specific voltage levels, the type of field-effect transistors, and the type of floating gate transistor are illustrative. Accordingly, other embodiments and variations not described herein may be within the scope of our invention, as defined by the appended claims.

I claim:

1. An interconnect cell for coupling a first lead to a second lead, said interconnect cell comprising:
    a first transistor, having first and second terminals defining a signal carrying path and a control terminal, coupled to said first lead and said second lead of said interconnected cell; and
    a non-volatile programmable cell connected to said control terminal of said first transistor;
    wherein said programmable cell transfers a first voltage to said control terminal to turn on/off said transistor, thereby coupling/decoupling said first lead to said second lead; and
    wherein said programmable cell comprises:
    a second transistor including a floating gate, a control gate, and source and drain regions, said drain of said second transistor connected to a first variable voltage source, said control gate of said second transistor connected to a second variable voltage source; and
    a third transistor having a control gate, source and drain regions, said source of said third transistor connected to a third variable voltage source, said gate of said third transistor connected to a fourth variable voltage source, said drain of said third transistor connected to said source region of said second transistor;
    wherein said first voltage is drawn from the common connection between said second transistor and said third transistor.

2. The interconnect cell of claim 1 wherein said programmable cell is programmably erasable.

3. The interconnect cell of claim 1 wherein said programmable cell is electrically erasable.

4. The interconnect cell of claim 1 wherein said first, second, third and fourth variable voltage sources selectively enable reading, writing and programming of said programmable cell, and threshold voltage verification of said second transistor.

5. A programmable cell comprising:
    a first transistor including a floating gate, a control gate, and source and drain regions, said drain region of said first transistor connected to a first variable voltage source, said control gate of said first transistor connected to a second variable voltage source; and
    a second transistor having a control gate, source and drain regions, said source region of said second transistor connected to a third variable voltage source, said gate of said second transistor connected to a fourth variable voltage source, said drain region of said second transistor connected to said source region of said first transistor;
    wherein a first voltage is drawn from the common connection between said second transistor and said first transistor.

6. The programmable cell of claim 5 wherein said programmable cell is programmably erasable.

7. The programmable cell of claim 5 wherein said programmable cell is electrically erasable.

8. The programmable cell of claim 5 wherein said first, second, third and fourth variable voltage sources selectively enable reading, writing and programming of said programmable cell, and threshold voltage verification of said first transistor.

9. An interconnect cell for coupling a first lead to a second lead, said interconnect cell comprising:
    a first transistor have a gate, source and drain regions, said drain of said first transistor connected to said first lead of said interconnect cell, said source of said first transistor connected to said second lead of said interconnect cell; and a non-volatile programmable cell connected to said gate of said first transistor;

wherein said programmable cell transfers a first voltage to said gate to control said transistor, thereby connecting/disconnecting said first lead to said second lead, wherein said programmable cell comprises:

a second transistor including a floating gate, a control gate, and source and drain regions, said drain of said second transistor connected to a first variable voltage source, said control gate of said second transistor connected to a second variable voltage source; and a third transistor having a control gate, source and drain regions, said source of said third transistor connected to a third variable voltage source, said gate of said third transistor connected to a fourth variable voltage source, said drain of said third transistor connected to said source region of said second transistor, wherein said first voltage is drawn from the common connection between said second transistor and said third transistor.

10. The interconnect cell of claim 9 wherein said programmable cell is programmably erasable.

11. The interconnect cell of claim 9 wherein said programmable cell is electrically erasable.

12. The interconnect cell of claim 9 wherein said first, second, third and fourth variable voltage sources selectively enable reading, writing and programming of said programmable cell, and threshold voltage verification of said second transistor.

* * * * *